US011616167B2

(12) United States Patent
Pernot et al.

(10) Patent No.: US 11,616,167 B2
(45) Date of Patent: Mar. 28, 2023

(54) NITRIDE SEMICONDUCTOR LIGHT-EMITTING ELEMENT AND METHOD FOR MANUFACTURING NITRIDE SEMICONDUCTOR LIGHT-EMITTING ELEMENT

(71) Applicant: NIKKISO CO., LTD., Tokyo (JP)

(72) Inventors: Cyril Pernot, Ishikawa (JP); Yusuke Matsukura, Ishikawa (JP); Yuta Furusawa, Ishikawa (JP); Mitsugu Wada, Ishikawa (JP)

(73) Assignee: Nikkiso Co., Ltd., Tokyo (JP)

( * ) Notice: Subject to any disclaimer, the term of this patent is extended or adjusted under 35 U.S.C. 154(b) by 0 days.

(21) Appl. No.: 16/647,072

(22) PCT Filed: Jul. 20, 2018

(86) PCT No.: PCT/JP2018/027388
§ 371 (c)(1),
(2) Date: Mar. 13, 2020

(87) PCT Pub. No.: WO2019/054053
PCT Pub. Date: Mar. 21, 2019

(65) Prior Publication Data
US 2020/0227590 A1    Jul. 16, 2020

(30) Foreign Application Priority Data

Sep. 15, 2017  (JP) .............................. JP2017-177659

(51) Int. Cl.
*H01L 33/20*  (2010.01)
*H01L 33/00*  (2010.01)
(Continued)

(52) U.S. Cl.
CPC .......... *H01L 33/20* (2013.01); *H01L 33/0075* (2013.01); *H01L 33/06* (2013.01); *H01L 33/32* (2013.01); *H01L 2933/0033* (2013.01)

(58) Field of Classification Search
CPC ......... H01L 33/06; H01L 33/04; H01L 33/32; H01L 33/0062; H01L 31/035236; H01L 29/152; H01L 21/02507; H01L 33/20
See application file for complete search history.

(56) References Cited

U.S. PATENT DOCUMENTS 6,329,667 B1   12/2001   Ota et al.
6,537,839 B2   3/2003    Ota et al.
(Continued)

FOREIGN PATENT DOCUMENTS

CN      106415860 A    2/2017
JP      2000-232238 A  8/2000
(Continued)

OTHER PUBLICATIONS

International Search Report dated Oct. 9, 2018 issued in PCT/JP2018/027388.
(Continued)

*Primary Examiner* — Eric K Ashbahian
(74) *Attorney, Agent, or Firm* — Scully, Scott, Murphy & Presser, PC

(57) ABSTRACT

A nitride semiconductor light-emitting element includes an n-type cladding layer including n-type AlGaN, and a multiple quantum well layer including a barrier layer that includes AlGaN and is located on the n-type cladding layer side, wherein the nitride semiconductor light-emitting element further comprises a trigger layer that is located between the n-type cladding layer and the barrier layer and comprises Si, wherein a plural V-pits starting from dislocations in the n-type cladding layer and ending in the multiple (Continued)

quantum well are formed in the n-type cladding layer and the multiple quantum well layer.

7 Claims, 4 Drawing Sheets

(51) Int. Cl.
*H01L 33/06* (2010.01)
*H01L 33/32* (2010.01)

(56) References Cited

U.S. PATENT DOCUMENTS

| | | | |
|---|---|---|---|
| 8,525,221 B2 | 9/2013 | Lester et al. | |
| 8,684,749 B2 | 4/2014 | Lester et al. | |
| 9,012,953 B2 | 4/2015 | Lester et al. | |
| 9,293,647 B2 | 3/2016 | Kashihara et al. | |
| 9,620,671 B2 | 4/2017 | Nakatsu et al. | |
| 10,084,111 B2 | 9/2018 | Tani et al. | |
| 10,790,409 B2 | 9/2020 | Tani et al. | |
| 2002/0084452 A1 | 7/2002 | Ota et al. | |
| 2007/0122994 A1 | 5/2007 | Sonobe et al. | |
| 2011/0121357 A1 | 5/2011 | Lester et al. | |
| 2013/0082273 A1* | 4/2013 | Ting | H01L 33/325 257/76 |
| 2013/0316483 A1 | 11/2013 | Lester et al. | |
| 2014/0151728 A1 | 6/2014 | Lester et al. | |
| 2014/0332756 A1 | 11/2014 | Kashihara et al. | |
| 2015/0060762 A1* | 3/2015 | Kim | H01L 33/06 257/13 |
| 2015/0171263 A1 | 6/2015 | Nakatsu et al. | |
| 2015/0221826 A1 | 8/2015 | Yang et al. | |
| 2016/0087146 A1* | 3/2016 | Yamane | H01L 33/06 257/13 |
| 2016/0118540 A1* | 4/2016 | Dong | H01L 33/06 257/13 |
| 2017/0186912 A1* | 6/2017 | Inoue | H01L 33/12 |
| 2017/0294554 A1 | 10/2017 | Tani et al. | |
| 2017/0317235 A1* | 11/2017 | Iguchi | H01L 33/025 |
| 2018/0062029 A1* | 3/2018 | Gomez-Iglesias | H01L 33/32 |
| 2018/0261724 A1* | 9/2018 | Park | H01L 33/0075 |
| 2018/0351039 A1* | 12/2018 | Kim | H01L 33/325 |
| 2019/0006555 A1 | 1/2019 | Tani et al. | |
| 2019/0067521 A1 | 2/2019 | Takano et al. | |
| 2020/0119228 A1* | 4/2020 | Lehnhardt | H01L 33/18 |
| 2020/0287084 A1* | 9/2020 | Liao | H01L 21/0237 |

FOREIGN PATENT DOCUMENTS

| | | | |
|---|---|---|---|
| JP | 2007-150076 A | 6/2007 | |
| JP | 2013-512567 A | 4/2013 | |
| JP | 2013-120774 A | 6/2013 | |
| JP | 2013-187484 A | 9/2013 | |
| JP | 5881393 B2 | 3/2016 | |
| JP | 2017-045787 A | 3/2017 | |
| JP | 2017-045787 A * | 3/2017 | H01L 33/06 |
| JP | 2017-139252 A | 8/2017 | |
| TW | 2014-03864 A | 1/2014 | |
| TW | 2016-18329 A | 5/2016 | |
| WO | WO 2015/186478 A1 | 12/2015 | |
| WO | WO 2016/047386 A1 | 3/2016 | |
| WO | WO 2016/108423 A1 | 7/2016 | |

OTHER PUBLICATIONS

Japanese Office Action dated Feb. 14, 2018 issued in JP 2017-177659.
Japanese Office Action dated Jun. 19, 2018 issued in JP 2017-177659.
Hangleiter, A. et al., "Suppression of Nonradiative Recombination by V-Shaped Pits in GaInN/GaN Quantum Wells Produces a Large Increase in the Light Emission Efficiency", Physical Review Letters 95, (2005), pp. 127402-1 to 127402-4.
Notice of Reasons for Refusal dated Dec. 15, 2020 received from the Japanese Patent Office in related application JP 2018-172339 together with English language translation.
Office Action dated May 19, 2019 received from the Taiwanese Patent Office in related application 107126602 together with English language translation.
First Office Action dated Nov. 2, 2022 received from the China National Intellectual Property Administration in related application CN 201880059036.3 together with English language translation.

* cited by examiner

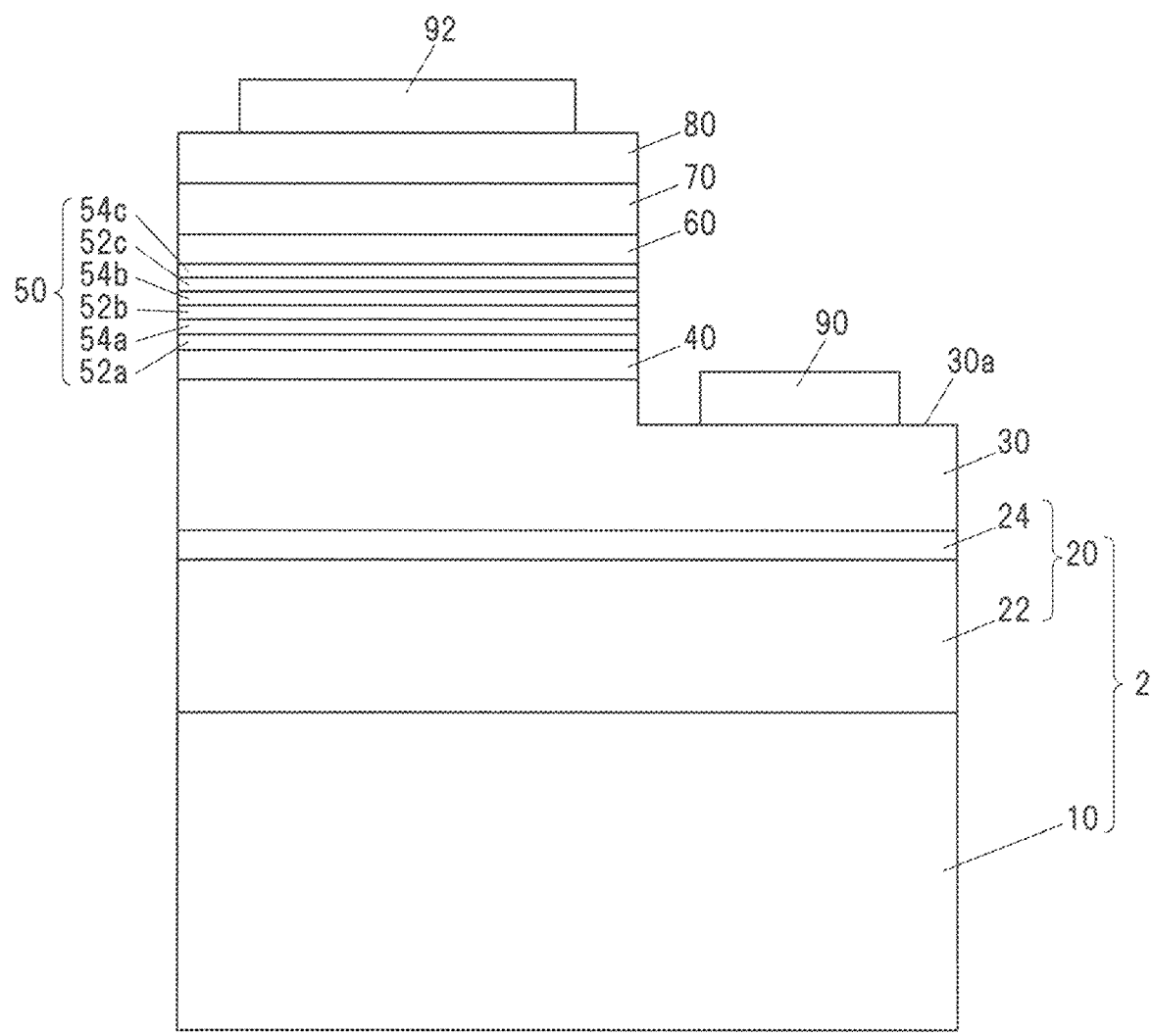

FIG.4

| CURRENT (mA) | EMISSION OUTPUT (a. u.) | | RATIO OF EMISSION OUTPUT IN EXAMPLE TO EMISSION OUTPUT IN COMPARATIVE EXAMPLE |
|---|---|---|---|
| | EXAMPLE | COMPARATIVE EXAMPLE | |
| 20 | 1700 | 1300 | 1.31 |
| 60 | 5000 | 3500 | 1.43 |
| 100 | 7800 | 5000 | 1.56 |
| 150 | 11000 | 7400 | 1.49 |

NITRIDE SEMICONDUCTOR LIGHT-EMITTING ELEMENT AND METHOD FOR MANUFACTURING NITRIDE SEMICONDUCTOR LIGHT-EMITTING ELEMENT

TECHNICAL FIELD

The invention relates to a nitride semiconductor light-emitting element and a method for manufacturing a nitride semiconductor light-emitting element.

BACKGROUND ART

In recent years, nitride semiconductor light-emitting elements such as light-emitting diodes or laser diodes which emit blue light have been put into practical use, and nitride semiconductor light-emitting elements with improved emission output have been under development (see Japanese Patent No. 5881393).

The nitride semiconductor light-emitting element described in Japanese Patent No. 5881393 includes an n-type nitride semiconductor layer, a trigger layer, a V-pit expansion layer, a multiple quantum well layer constituting a light-emitting layer, and a p-type nitride semiconductor layer which are provided in this order, and the nitride semiconductor light-emitting element is configured that V-pits are formed in the multiple quantum well layer, the trigger layer is formed of a nitride semiconductor material having a lattice constant different from that of the material constituting the top surface of the n-type nitride semiconductor layer, and the V-pit expansion layer is formed of a nitride semiconductor material having a lattice constant substantially the same as that of the material constituting the top surface of the n-type nitride semiconductor layer and has a thickness of not less than 5 nm and not more than 5000 nm.

In the meantime, Non-Patent Literature 1 describes the effect of V-pits in the multiple quantum well layer. In particular, Non-Patent Literature 1 describes as follows: when there are V-pits in the multiple quantum well layer, the quantum well width at inclined surfaces of the V-pits is narrow. Therefore, an effective band gap is broadened due to an increase in quantum level energy, and electrons/holes are prevented from reaching the inside of the V-pits in the quantum well, resulting in that nonradiative recombination in the multiple quantum well layer is suppressed. The nitride semiconductor light-emitting element described in Japanese Patent No. 5881393 is an invention which is made based on this technical idea related to the effect of V-pits present in the multiple quantum well layer.

CITATION LIST

Patent Literature

Japanese Patent No. 5881393

Non-Patent Literature

Non-Patent Literature 1: A. Hangleiter, F. Hitzel, C. Netzel, D. Fuhrmann, U. Rossow, G Ade, and P. Hinze, "Suppression of Nonradiative Recombination by V-shaped Pits in GaInN/GaN Quantum Wells Produces a Large Increase in the Light Emission Efficiency", Physical Review Letters 95, 127402 (2005)

SUMMARY OF INVENTION

Technical Problem

In the nitride semiconductor light-emitting element described in Japanese Patent No. 5881393, since the trigger layer is formed of a nitride semiconductor material having a lattice constant different from that of the material constituting the top surface of the n-type nitride semiconductor layer, a layer containing a nitride semiconductor material having a lattice constant substantially the same as that of the material constituting the top surface of the n-type nitride semiconductor layer needs to be further formed as the V-pit expansion layer. This increases the number of processes for forming the nitride semiconductor light-emitting element and also may cause an increase in the manufacturing cost.

It is an object of the invention to provide a nitride semiconductor light-emitting element of which emission output can be improved by forming V-pits in a multiple quantum well layer without forming, on an n-type nitride semiconductor, a trigger layer formed of a nitride semiconductor material having a lattice constant different from that of the material constituting the top surface of the n-type nitride semiconductor layer. It is also an object of the invention to provide a method for manufacturing such a nitride semiconductor light-emitting element.

Solution to Problem

A nitride semiconductor light-emitting element in an embodiment of the invention comprises an n-type cladding layer comprising n-type AlGaN; and a multiple quantum well layer comprising a barrier layer that comprises AlGaN and is located on the n-type cladding layer side, where the nitride semiconductor light-emitting element further comprises a trigger layer that is located between the n-type cladding layer and the barrier layer and comprises Si, wherein a plurality of V-pits starting from dislocations in the n-type cladding layer and ending in the multiple quantum well are formed in the n-type cladding layer and the multiple quantum well layer.

A method for manufacturing a nitride semiconductor light-emitting element in another embodiment of the invention comprises forming an n-type cladding layer comprising n-type AlGaN on a substrate; forming a multiple quantum well layer comprising a barrier layer that comprises AlGaN and is located on the n-type cladding layer side; and forming a trigger layer that is located between the n-type cladding layer and the barrier layer and comprises Si, wherein the forming the trigger layer is performed while adjusting a supplied amount of Si to be $5.0 \times 10^9$ to $5.0 \times 10^{10}$ times the density of the dislocations contained in the n-type cladding layer.

Advantageous Effects of Invention

According to an embodiment of the invention, it is possible to provide a nitride semiconductor light-emitting element of which emission output can be improved by forming V-pits in a multiple quantum well layer without forming, on an n-type nitride semiconductor, a trigger layer formed of a nitride semiconductor material having a lattice constant different from that of the material constituting the top surface of the n-type nitride semiconductor layer. It is also possible to provide a method for manufacturing such a nitride semiconductor light-emitting element.

BRIEF DESCRIPTION OF DRAWINGS

FIG. 1 is a schematic cross-sectional view showing an exemplary configuration of a nitride semiconductor light-emitting element in an embodiment of the present invention.

FIG. 4 is a table showing example data of current supplied in a forward direction and emission output in Example and Comparative Example shown in FIG. 3.

DESCRIPTION OF EMBODIMENT

Embodiment

Figure 2A:
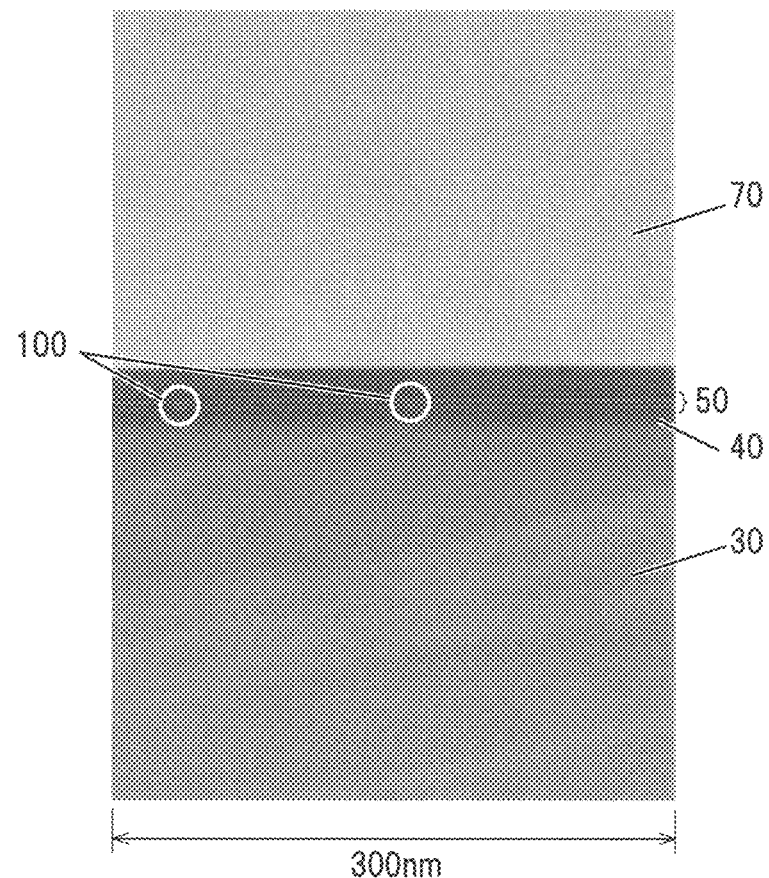
FIG. 2A is an image showing a cross section of the nitride semiconductor light-emitting element in which V-pits are formed.

An embodiment of the invention will be described in reference to FIGS. 1 to 4. The embodiment below is described as a preferred example for implementing the invention. Although some part of the embodiment specifically illustrates various technically preferable matters, the technical scope of the invention is not limited to such specific aspects. In addition, a scale ratio of each constituent element in each drawing is not necessarily the same as the actual scale ratio of the nitride semiconductor light-emitting element.

FIG. 1 is a schematic cross-sectional view showing an exemplary configuration of a nitride semiconductor light-emitting element in an embodiment of the invention. A nitride semiconductor light-emitting element 1 (hereinafter, also simply referred to as "light-emitting element 1") is a light-emitting diode (LED) which emits light with a wavelength in the ultraviolet region. In the present embodiment, the light-emitting element 1 emitting deep ultraviolet light with a central wavelength of 250 nm to 350 nm is specifically described as an example.

As shown in FIG. 1, the light-emitting element 1 includes a substrate 10, a buffer layer 20, an n-type cladding layer 30, a trigger layer 40, a multiple quantum well layer 50, an electron blocking layer 60, a p-type cladding layer 70, a p-type contact layer 80, an n-side electrode 90 and a p-side electrode 92.

The semiconductor which can be used to form the light-emitting element 1 is, e.g., a group III nitride semiconductor which is expressed by $Al_xGa_{1-x}N$ ($0 \leq x \leq 1$). In addition, the group III elements thereof may be partially substituted with indium (In), boron (B) or thallium (Tl), etc., and N may be partially substituted with phosphorus (P), arsenic (As), antimony (Sb) or bismuth (Bi), etc.

The substrate 10 is transparent to deep ultraviolet light emitted by the light-emitting element 1. The substrate 10 is, e.g., a sapphire ($Al_2O_3$) substrate containing sapphire ($Al_2O_3$). Besides the sapphire ($Al_2O_3$) substrate, e.g., an aluminum nitride (AlN) substrate or an aluminum gallium nitride (AlGaN) substrate may be used as the substrate 10.

The buffer layer 20 is formed on the substrate 10. The buffer layer 20 includes an AlN layer 22 and a u-$Al_pGa_{1-p}N$ layer 24 ($0 \leq p \leq 1$) which is undoped and formed on the AlN layer 22. The substrate 10 and the buffer layer 20 constitute a foundation structure 2. The u-$Al_pGa_{1-p}N$ layer 24 may not be necessarily provided.

The n-type cladding layer 30 is formed on the foundation structure 2. The n-type cladding layer 30 is a layer formed of AlGaN with n-type conductivity (hereinafter, also simply referred to as "n-type AlGaN") and is, e.g., an $Al_qGa_{1-q}N$ layer ($0 \leq q \leq 1$) doped with silicon (Si) as an n-type impurity. Alternatively, germanium (Ge), selenium (Se), tellurium (Te) or carbon (C), etc., may be used as the n-type impurity. The n-type cladding layer 30 has a thickness of about 1 μm to 3 μm and is, e.g., about 2 μm in thickness. The n-type cladding layer 30 may be a single layer or may have a multilayer structure.

The trigger layer 40 is formed on the n-type cladding layer 30. The trigger layer 40 is a layer which serves to cause V-pits 100 (see FIG. 2A) to be formed in the multiple quantum well layer 50 (described layer). The trigger layer 40 has a thickness of about 1 to 100 nm and is, e.g., about 25 nm in thickness.

The trigger layer 40 is a layer comprising silicon (Si). The Si concentration in the trigger layer 40 is appropriately adjusted according to the density of defects such as dislocations occurred in the n-type cladding layer 30. As an example, when the n-type cladding layer 30 has $1.0 \times 10^9$ dislocations per $cm^3$, the Si concentration in the trigger layer 40 is, e.g., $5.0 \times 10^{18}$ $cm^{-3}$ to $5.0 \times 10^{19}$ $cm^{-3}$.

The multiple quantum well layer 50 constituting the light-emitting layer is formed on the trigger layer 40. The multiple quantum well layer 50 is formed in such a manner that three $Al_rGa_{1-r}N$ barrier layers 52a, 52b, 52c, including the barrier layer 52a located on the n-type cladding layer 30 side in the multiple quantum well layer, and three $Al_sGa_{1-s}N$ well layer 54a, 54b, 54c ($0 \leq r \leq 1$, $0 \leq s \leq 1$, r>s) are alternately stacked. The multiple quantum well layer 50 is configured to have a band gap of not less than 3.4 eV so that deep ultraviolet light with a wavelength of not more than 350 nm is output. Although the multiple quantum well layer 50 is provided with the three barrier layers 52a, 52b, 52c and the three well layer 54a, 54b, 54c in the present embodiment, the number of the respective layers is not limited to three, and may be two, or not less than four.

Figure 2B:
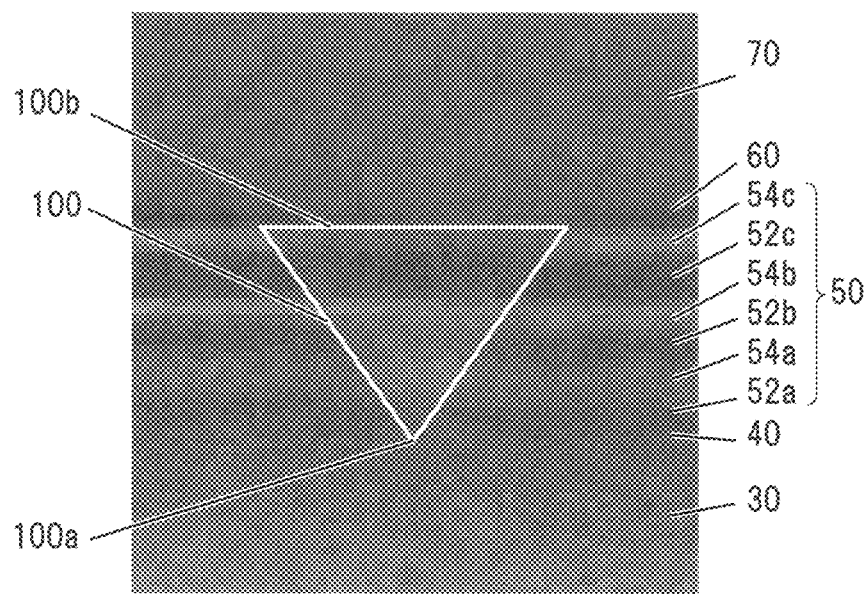
FIG. 2B is an enlarged image which is obtained by enlarging portions of FIG. 2A and shows the V-pit.

Next, the V-pit 100 will be described in reference to FIGS. 2A and 2B. FIG. 2A is an image showing a cross section of the nitride semiconductor light-emitting element in which the V-pits 100 are formed, and FIG. 2B is an enlarged image which is obtained by enlarging portions of FIG. 2A (portions circled in FIG. 2A) and shows the V-pit 100. The images shown in FIGS. 2A and 2B are both SEM (Scanning Electron Microscope) images.

As shown in FIG. 2A, plural V-pits 100 are formed in the multiple quantum well layer 50. The V-pit 100 is a type of crystal defect formed due to, e.g., misalignment in the crystal which can occur during the growth. The plural V-pits 100 originating from defects such as dislocations present in the n-type cladding layer 30 are formed by providing the trigger layer 40. As shown in FIG. 2B, each V-pit 100 has a substantially inverted cone shape (see a dotted line in FIG. 2B) which extends in the thickness direction of the light-emitting element 1 through the plural barrier layers 52a, 52b, 52c and the plural well layer 54a, 54b, 54c and is arranged so that an apex 100a faces toward the n-type cladding layer 30 (downward in the drawing).

In other words, the V-pit 100 has a substantially V-shape opening toward the electron blocking layer 60 (upward in the drawing) in a vertical cross section as shown in FIG. 2B, and a substantially circular shape in a horizontal cross section. Here, the vertical cross section is a cross section parallel to the thickness direction of the light-emitting element 1 and the horizontal cross section is a cross section perpendicular to the thickness direction of the light-emitting element 1. However, the shape of the V-pit 100 is not limited to the substantially inverted cone shape and may be a hexagonal pyramid shape, a polygonal pyramid shape, an elliptic cone shape or a polygonal column shape, etc.

The V-pit 100 starts with the apex 100a from a dislocation in the n-type cladding layer 30 and ends with a bottom surface 100b in the multiple quantum well layer 50. Preferably, the bottom surface 100b of the V-pit 100 has a diameter of not more than 100 nm. In this regard, when the bottom surface 100b of the V-pit 100 does not have a circular shape, the diameter of the V-pit 100 is a diameter when, e.g., the shape of the bottom surface 100b is approximated to a circle and is, e.g., a circumscribed circle. In addition, the V-pit 100 has a thickness of about 10 nm to 30 nm and is, e.g., about 20 nm in thickness. The thickness of the V-pit here is a length of the V-pit 100 in the thickness direction of the light-emitting element 1 in the vertical cross section.

The electron blocking layer 60 is formed on the multiple quantum well layer 50. The electron blocking layer 60 is a layer formed of AlGaN with p-type conductivity (hereinafter, also simply referred to as "p-type AlGaN"). The electron blocking layer 60 has a thickness of about 1 nm to 10 nm. Alternatively, the electron blocking layer 60 may include a layer formed of AlN. In addition, the electron blocking layer 60 is not necessarily limited to a p-type semiconductor layer and may be an undoped semiconductor layer.

The p-type cladding layer 70 is formed on the electron blocking layer 60. The p-type cladding layer 70 is a layer formed of p-type AlGaN and is, e.g., an $Al_tGa_{1-t}N$ cladding layer ($0 \leq t \leq 1$) doped with magnesium (Mg) as a p-type impurity. Alternatively, zinc (Zn), beryllium (Be), calcium (Ca), strontium (Sr) or barium (Ba), etc., may be used as the p-type impurity. The p-type cladding layer 70 has a thickness of about 300 nm to 700 nm and is, e.g., about 400 nm to 600 nm in thickness.

The p-type contact layer 80 is formed on the p-type cladding layer 70. The p-type contact layer 80 is, e.g., a p-type GaN layer doped with a high concentration of impurity such as Mg.

The n-side electrode 90 is formed on a certain region of the n-type cladding layer 30. The n-side electrode 90 is formed of, e.g., a multilayered film formed by sequentially stacking titanium (Ti), aluminum (Al), Ti and gold (Au) on the n-type cladding layer 30.

The p-side electrode 92 is formed on the p-type contact layer 80. The p-side electrode 92 is formed of, e.g., a multilayered film formed by sequentially stacking nickel (Ni) and gold (Au) on the p-type contact layer 80.

Next, a method for manufacturing the light-emitting element 1 will be described. The buffer layer 20 is formed on the substrate 10. In detail, the MN layer 22 and the undoped u-$Al_pGa_{1-p}N$ layer 24 are grown on the substrate 10 at high temperature. Next, the n-type cladding layer 30 is grown on the buffer layer 20 at high temperature.

Next, the trigger layer 40 is grown on the n-type cladding layer 30 at high temperature while appropriately adjusting a doping amount of Si according to the density of defects such as dislocations contained in the high-temperature n-type cladding layer 30. The doping amount of Si is adjusted so that the Si concentration of, e.g., $5.0 \times 10^{18}$ cm$^{-3}$ to $5.0 \times 10^{19}$ cm$^{-3}$ mentioned above is obtained. Next, the multiple quantum well layer 50, the electron blocking layer 60 and the p-type cladding layer 70 are sequentially grown on the trigger layer 40 at high temperature.

The n-type cladding layer 30, the trigger layer 40, the multiple quantum well layer 50, the electron blocking layer 60 and the p-type cladding layer 70 can be formed by a well-known epitaxial growth method such as Metal Organic Chemical Vapor Deposition (MOCVD), Molecular Beam Epitaxy (MBE), or Halide Vapor Phase Epitaxy (HVPE).

Next, a mask is formed on the p-type cladding layer 70. Then, in the exposed region in which the mask is not formed, the trigger layer 40, the multiple quantum well layer 50, the electron blocking layer 60 and the p-type cladding layer 70 are removed. The trigger layer 40, the multiple quantum well layer 50, the electron blocking layer 60 and the p-type cladding layer 70 can be removed by, e.g., plasma etching. The n-side electrode 90 is formed on an exposed surface 30a of the n-type cladding layer 30 (see FIG. 1), and the p-side electrode 92 is formed on the p-type contact layer 80 after removing the mask. The n-side electrode 90 and the p-side electrode 92 can be formed by, e.g., a well-known method such as electron beam evaporation method or sputtering method. The light-emitting element 1 shown in FIG. 1 is thereby obtained.

Example

As described above, the trigger layer 40 contains comprises Si which is doped at a concentration according to the density of defects such as dislocations in the n-type cladding layer 30. The trigger layer 40 is arranged between the n-type cladding layer 30 and the multiple quantum well layer 50 which has the barrier layer 52a formed of AlGaN and provided as the outermost layer on the n-type cladding layer 30 side. Due to this configuration, the plural V-pits 100 corresponding to the defect density and having a substantially inverted cone shape are formed, which originate from defects such as dislocations in the n-type cladding layer 30, extend through the plural barrier layers 52a, 52b, 52c and the plural well layer 54a, 54b, 54c of the multiple quantum well layer 50, and terminate in e.g., the well layer 54c of the multiple quantum well layer 50 which is formed of AlGaN and provided as the outermost layer on the electron blocking layer 60 side (on the side opposite to the n-type cladding layer 30). It was confirmed that such plural V-pits 100 improve emission output of the light-emitting element 1.

Figure 3:
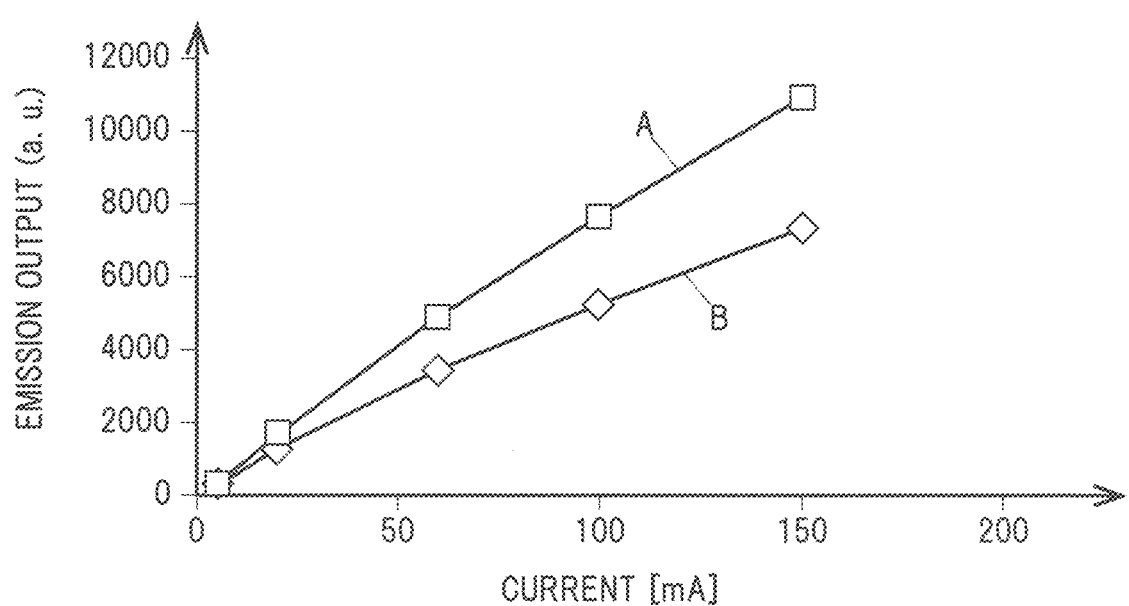
FIG. 3 is a graph showing an example of a relation between emission wavelength and emission output in Example and Comparative Example.

Next, the experiment which confirmed such improvement in emission output will be described in reference to FIG. 3. FIG. 3 is a graph showing an example of a relation between a current supplied in a forward direction and emission output in Example and Comparative Example. In FIG. 3, the horizontal axis indicates a current (mA) applied to the light-emitting element 1 and the vertical axis indicates emission output (arbitrary unit). The line labeled A shows the data of Example and the line labeled B shows the data of Comparative Example. FIG. 4 is a table showing data of a current supplied in a forward direction and emission output in Example and Comparative Example shown in FIG. 3. The light-emitting element used as Comparative Example had a structure in which the trigger layer 40 is not formed in the light-emitting element 1 described above.

As shown in FIGS. 3 and 4, in Example, an emission output of about 1700 was obtained at an applied current of about 20 mA, an emission output of about 5000 was obtained at an applied current of about 60 mA, an emission output of about 7800 was obtained at an applied current of 100 mA, and an emission output of about 11000 was obtained at an applied current of 150 mA. In contrast to this, in Comparative Example, an emission output of about 1300 was obtained at an applied current of about 20 mA, an emission output of about 3500 was obtained at an applied current of about 60 mA, an emission output of about 5000 was obtained at an applied current of 100 mA, and an emission output of about 7400 was obtained at an applied current of 150 mA.

In sum, the emission output in Example was about 1.31 times the emission output in Comparative Example at an applied current of 20 mA, about 1.43 times the emission output in Comparative Example at an applied current of 60 mA, about 1.56 times the emission output in Comparative Example at an applied current of 100 mA, and about 1.49 times the emission output in Comparative Example at an applied current of 150 mA. As such, the emission output in Example was at least 20% or more better in the range of the applied current. These results show that the light-emitting element 1 has an increased emission output.

Functions and Effects of the Embodiment

As described above, the light-emitting element 1 in the embodiment of the invention is configured that the trigger layer 40 comprising Si doped at a concentration according to the density of defects such as dislocations in the n-type cladding layer 30 is provided between the n-type cladding layer 30 and the barrier layer 52a located on the n-type cladding layer 30 side in the multiple quantum well layer. The trigger layer 40 triggers formation of V-pits originating from defects such as dislocations occurred in the n-type cladding layer 30, and plural V-pits having a substantially inverted cone shape and extending through the plural barrier layers 52a, 52b, 52c and the plural well layer 54a, 54b, 54c are formed in the multiple quantum well layer 50. Due to this configuration, it is possible to increases the emission output of deep ultraviolet light of the light-emitting element 1. It is considered that the V-pits formed in the multiple quantum well layer by providing the trigger layer 40 suppress non-radiative recombination which could occur in the multiple quantum well layer due to dislocations.

Summary of the Embodiment

Technical ideas understood from the embodiment will be described below citing the reference numerals, etc., used for the embodiment. However, each reference numeral, etc., described below is not intended to limit the constituent elements in the claims to the members, etc., specifically described in the embodiment.

[1] A nitride semiconductor light-emitting element (1), comprising: an n-type cladding layer (30) comprising n-type AlGaN; and a multiple quantum well layer (50) comprising a barrier layer (52a) that comprises AlGaN and is located on the n-type cladding layer side (30), wherein the nitride semiconductor light-emitting element further comprises a trigger layer (40) that is located between the n-type cladding layer (30) and the barrier layer (52a) and comprises Si, wherein a plurality of V-pits (100) starting from dislocations in the n-type cladding layer (30) and ending in the multiple quantum well (50) are formed in the n-type cladding layer (30) and the multiple quantum well layer (50).
[2] The nitride semiconductor light-emitting element (1) described in the above [1], wherein a Si concentration in the trigger layer (40) is $5.0 \times 10^9$ to $5.0 \times 10^{10}$ times the density of the dislocations in the n-type cladding layer (30).
[3] The nitride semiconductor light-emitting element (1) described in the above [1] or [2], wherein the plurality of V-pits (100) each have a substantially inverted cone shape that extends in the thickness direction of the nitride semiconductor light-emitting element (1).
[4] The nitride semiconductor light-emitting element (1) described in the above [3], wherein the plurality of V-pits (100) each have a circular shape with a diameter of not more than 100 nm in a cross section perpendicular to the thickness direction of the nitride semiconductor light-emitting element (1).
[5] The nitride semiconductor light-emitting element (1) described in the above [1] or [2], wherein the plurality of V-pits (100) each have a thickness of 10 nm to 30 nm.
[6] A method for manufacturing a nitride semiconductor light-emitting element (1), comprising: forming an n-type cladding layer (30) comprising n-type AlGaN on a substrate (10); forming a multiple quantum well layer (50) comprising a barrier layer (52a, 52b, 52c) that comprises AlGaN and is located on the n-type cladding layer (30) side; and forming a trigger layer (40) that is located between the n-type cladding layer (30) and the barrier layer (52a) and comprises Si, wherein the forming the trigger layer (40) is performed while adjusting a supplied amount of Si to be $5.0 \times 10^9$ to $5.0 \times 10^{10}$ times the density of the dislocations contained in the n-type cladding layer (30).

INDUSTRIAL APPLICABILITY

Provided is a nitride semiconductor light-emitting element of which emission output can be improved by forming V-pits in a multiple quantum well layer without forming, on an n-type nitride semiconductor, a trigger layer formed of a nitride semiconductor material having a lattice constant different from that of the material constituting the top surface of the n-type nitride semiconductor layer. A method for manufacturing such a nitride semiconductor light-emitting element is also provided.

REFERENCE SIGNS LIST

1: nitride semiconductor light-emitting element (light-emitting element)
10: substrate
30: n-type cladding layer
40: trigger layer
50: multiple quantum well layer
52, 52a, 52b, 52c: barrier layer
54, 54a, 54b, 54c: well layer
100: V-pit

The invention claimed is:
1. A nitride semiconductor light-emitting element, comprising:
an n-type cladding layer comprising n-type AlGaN; and
a multiple quantum well layer comprising a barrier layer that comprises AlGaN and is located on the n-type cladding layer side,
wherein the nitride semiconductor light-emitting element further comprises a trigger layer that is located between the n-type cladding layer and the barrier layer and comprises Si,
wherein a plurality of V-pits starting from dislocations in the n-type cladding layer and ending in the multiple quantum well are formed in the n-type cladding layer and the multiple quantum well layer,
wherein the plurality of V-pits each have a thickness of 10 nm to 20 nm,
wherein the trigger layer directly contacts the multiple quantum well layer and the n-type cladding layer,
wherein the multiple quantum well layer emits deep ultraviolet light with a central wavelength of 250 nm to 350 nm, wherein the plurality of V-pits each have a circular shape bottom surface with a diameter of not more than 100 nm in a cross section perpendicular to the thickness direction of the nitride semiconductor light-emitting element, a p-type cladding layer on a surface of the multiple quantum well layer opposite that of the trigger layer, a p-type contact layer on a surface of the p-type cladding layer opposite that of the multiple quantum well layer; and an electron blocking layer formed between the multiple quantum well layer and the p-type cladding layer, wherein the electron blocking layer includes AlN.

2. The nitride semiconductor light-emitting element according to claim 1, wherein the plurality of V-pits each have a substantially inverted cone shape that extends in the thickness direction of the nitride semiconductor light-emitting element.

3. The nitride semiconductor light-emitting element according to claim 1, wherein a Si concentration in the trigger layer is $5.0 \times 10^9$ to $5.0 \times 10^{10}$ times the density of the dislocations in the n-type cladding layer.

4. The nitride semiconductor light-emitting element according to claim 1, wherein there are no metal nanoparticles filled in each V-pit.

5. A method for manufacturing a nitride semiconductor light-emitting element, comprising:

forming an n-type cladding layer comprising n-type AlGaN on a substrate;

forming a multiple quantum well layer comprising a barrier layer that comprises AlGaN and is located on the n-type cladding layer side; and forming a trigger layer to directly contact the multiple quantum well layer and the n-type cladding layer, which is located between the n-type cladding layer and the barrier layer and comprises Si, wherein the forming the trigger layer is performed while adjusting a supplied amount of Si to be $5.0 \times 10^9$ to $5.0 \times 10^{10}$ times the density of the dislocations contained in the n-type cladding layer, wherein a plurality of V-pits starting from dislocations in the n-type cladding layer and ending in the multiple quantum well are formed in the n-type cladding layer and the multiple quantum well layer, wherein the plurality of V-pits each have a thickness of 10 nm to 20 nm, wherein the multiple quantum well layer emits deep ultraviolet light with a central wavelength of 250 nm to 350 nm, wherein the plurality of V-pits each have a circular shape bottom surface with a diameter of not more than 100 nm in a cross section perpendicular to the thickness direction of the nitride semiconductor light-emitting element, a p-type cladding layer on a surface of the multiple quantum well layer opposite that of the trigger layer, a p-type contact layer on a surface of the p-type cladding layer opposite that of the multiple quantum well layer; and an electron blocking layer formed between the multiple quantum well layer and the p-type cladding layer, wherein the electron blocking layer includes AlN.

6. The method for manufacturing a nitride semiconductor light-emitting element according to claim 5, wherein the plurality of V-pits each have a substantially inverted cone shape that extends in the thickness direction of the nitride semiconductor light-emitting element.

7. The method for manufacturing a nitride semiconductor light-emitting element according to claim 5, wherein a Si concentration in the trigger layer is $5.0 \times 10^9$ to $5.0 \times 10^{10}$ times the density of the dislocations in the n-type cladding layer.

* * * * *